US010680556B2

(12) United States Patent
Khlat

(10) Patent No.: US 10,680,556 B2
(45) Date of Patent: Jun. 9, 2020

(54) RADIO FREQUENCY FRONT-END CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/180,887

(22) Filed: Nov. 5, 2018

(65) Prior Publication Data

US 2020/0144966 A1 May 7, 2020

(51) Int. Cl.
| H03F 1/02 | (2006.01) |
| H03F 3/21 | (2006.01) |
| H03F 3/19 | (2006.01) |
| H04B 1/40 | (2015.01) |
| H02M 3/07 | (2006.01) |

(52) U.S. Cl.
CPC ............. *H03F 1/0211* (2013.01); *H03F 3/19* (2013.01); *H03F 3/21* (2013.01); *H04B 1/40* (2013.01); *H02M 3/07* (2013.01); *H03F 2200/102* (2013.01); *H03F 2200/105* (2013.01); *H03F 2200/451* (2013.01)

(58) Field of Classification Search
CPC .................................................. H03F 1/0211
USPC ........................................................ 330/127
See application file for complete search history.

(56) References Cited

U.S. PATENT DOCUMENTS

| 5,838,732 | A  | 11/1998 | Carney |
| 6,107,862 | A  | 8/2000  | Mukainakano et al. |
| 6,141,377 | A  | 10/2000 | Sharper et al. |
| 6,985,033 | B1 | 1/2006  | Shirali et al. |
| 7,043,213 | B2 | 5/2006  | Robinson et al. |
| 7,471,155 | B1 | 12/2008 | Levesque |
| 7,570,931 | B2 | 8/2009  | McCallister et al. |
| 8,461,928 | B2 | 6/2013  | Yahav et al. |
| 8,493,141 | B2 | 7/2013  | Khlat et al. |
| 8,718,188 | B2 | 5/2014  | Balteanu et al. |
| 8,725,218 | B2 | 5/2014  | Brown et al. |
| 8,774,065 | B2 | 7/2014  | Khlat et al. |
| 8,803,603 | B2 | 8/2014  | Wimpenny |

(Continued)

OTHER PUBLICATIONS

Notice of Allowance for U.S. Appl. No. 16/150,556, dated Jul. 29, 2019, 7 pages.

(Continued)

*Primary Examiner* — Patricia T Nguyen
(74) *Attorney, Agent, or Firm* — Withrow & Terranova, P.L.L.C.

(57) ABSTRACT

A radio frequency (RF) front-end circuit is provided. A power management circuit is configured to output a first modulated voltage, a second modulated voltage, a first bias voltage, and a second bias voltage via a first voltage port(s), a second voltage port(s), a first bias voltage port(s), and a second bias voltage port(s), respectively. An amplifier circuit (s) is configured to amplify an RF signal based on a selected modulated voltage and a selected bias voltage outputted by a selected voltage port and a selected bias voltage port, respectively. The power management circuit can be controlled to dynamically increase the selected bias voltage at the selected bias voltage port in case the selected bias voltage drops below a defined bias voltage threshold. As such, it may be possible to maintain the selected bias voltage at a desirable level, thus enabling the amplifier circuit(s) to operate with improved linearity and efficiency.

21 Claims, 6 Drawing Sheets

(56) References Cited

U.S. PATENT DOCUMENTS

| | | | |
|---|---|---|---|
| 8,879,665 B2 | 11/2014 | Xia et al. | |
| 8,913,690 B2 | 12/2014 | Onishi | |
| 8,989,682 B2 | 3/2015 | Ripley et al. | |
| 9,020,451 B2 | 4/2015 | Khlat | |
| 9,041,364 B2 | 5/2015 | Khlat | |
| 9,041,365 B2 | 5/2015 | Kay et al. | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,830 B2 | 10/2015 | Camuffo et al. | |
| 9,197,182 B2 | 11/2015 | Baxter et al. | |
| 9,225,362 B2 | 12/2015 | Drogi et al. | |
| 9,263,997 B2 | 2/2016 | Vinayak | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,981 B2 | 3/2017 | Khlat | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,923,520 B1 | 3/2018 | Abdelfattah et al. | |
| 10,003,416 B1 | 6/2018 | Lloyd | |
| 10,110,169 B2 | 10/2018 | Khesbak et al. | |
| 10,158,330 B1 | 12/2018 | Khlat | |
| 10,170,989 B2* | 1/2019 | Balteanu | G05F 1/56 |
| 2002/0167827 A1 | 11/2002 | Umeda et al. | |
| 2004/0266366 A1 | 12/2004 | Robinson et al. | |
| 2005/0090209 A1* | 4/2005 | Behzad | H03F 1/0261 |
| | | | 455/115.1 |
| 2005/0227646 A1 | 10/2005 | Yamazaki et al. | |
| 2005/0232385 A1 | 10/2005 | Yoshikawa et al. | |
| 2006/0240786 A1 | 10/2006 | Liu | |
| 2007/0052474 A1* | 3/2007 | Saito | H03F 1/0277 |
| | | | 330/51 |
| 2009/0016085 A1 | 1/2009 | Rader et al. | |
| 2009/0045872 A1 | 2/2009 | Kenington | |
| 2010/0308919 A1* | 12/2010 | Adamski | G05F 1/56 |
| | | | 330/291 |
| 2011/0074373 A1 | 3/2011 | Lin | |
| 2011/0136452 A1 | 6/2011 | Pratt et al. | |
| 2011/0175681 A1* | 7/2011 | Inamori | H03F 1/0211 |
| | | | 330/296 |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0130724 A1 | 5/2013 | Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0103995 A1 | 4/2014 | Langer | |
| 2014/0155002 A1 | 6/2014 | Dakshinamurthy et al. | |
| 2014/0184335 A1* | 7/2014 | Nobbe | H03F 1/0227 |
| | | | 330/291 |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2015/0071382 A1 | 3/2015 | Wu et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0173031 A1 | 6/2016 | Langer | |
| 2016/0187627 A1 | 6/2016 | Abe | |
| 2016/0197627 A1 | 7/2016 | Qin et al. | |
| 2016/0294587 A1 | 10/2016 | Jiang et al. | |
| 2017/0141736 A1 | 5/2017 | Pratt et al. | |
| 2017/0302183 A1 | 10/2017 | Young | |
| 2017/0317913 A1 | 11/2017 | Kim et al. | |
| 2017/0338773 A1 | 11/2017 | Balteanu et al. | |
| 2018/0048276 A1 | 2/2018 | Khlat | |
| 2018/0076772 A1 | 3/2018 | Khesbak et al. | |
| 2018/0302042 A1 | 10/2018 | Zhang et al. | |
| 2018/0309414 A1 | 10/2018 | Khlat et al. | |
| 2018/0367101 A1 | 12/2018 | Chen et al. | |
| 2019/0068234 A1 | 2/2019 | Khlat et al. | |
| 2019/0097277 A1 | 3/2019 | Fukae | |
| 2019/0109566 A1 | 4/2019 | Folkmann et al. | |
| 2019/0109613 A1 | 4/2019 | Khlat et al. | |

OTHER PUBLICATIONS

Non-Final Office Action for U.S. Appl. No. 15/888,300, dated Jun. 27, 2019, 17 pages.
Pfister, Henry, "Discrete-Time Signal Processing," Lecture Note, pfister.ee.duke.edu/courses/ece485/dtsp.pdf, Mar. 3, 2017, 22 pages.
Advisory Action for U.S. Appl. No. 15/888,300, dated Jun. 5, 2019, 3 pages.
Non-Final Office Action for U.S. Appl. No. 15/888,260, dated May 2, 2019, 14 pages.
Notice of Allowance for U.S. Appl. No. 15/984,566, dated May 21, 2019, 6 pages.
U.S. Appl. No. 16/122,611, filed Sep. 5, 2018.
U.S. Appl. No. 15/704,131, filed Sep. 14, 2017.
U.S. Appl. No. 15/728,202, filed Oct. 9, 2017.
U.S. Appl. No. 15/792,909, filed Oct. 25, 2017.
U.S. Appl. No. 15/902,244, filed Feb. 22, 2018.
U.S. Appl. No. 15/888,260, filed Feb. 5, 2018.
U.S. Appl. No. 15/888,300, filed Feb. 5, 2018.
U.S. Appl. No. 15/984,566, filed May 21, 2018.
U.S. Appl. No. 15/986,948, filed May 23, 2018.
U.S. Appl. No. 16/018,426, filed Jun. 26, 2018.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Notice of Allowance for U.S. Appl. No. 15/902,244, dated Feb. 8, 2019, 8 pages.
Non-Final Office Action for U.S. Appl. No. 15/986,948, dated Mar. 28, 2019, 8 pages.

(56) References Cited

OTHER PUBLICATIONS

Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Final Office Action for U.S. Appl. No. 15/986,948, dated Aug. 27, 2019, 9 pages.
Final Office Action for U.S. Appl. No. 16/018,426, dated Sep. 4, 2019, 12 pages.
Notice of Allowance for U.S. Appl. No. 15/888,300, dated Jan. 14, 2020, 11 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Advisory Action for U.S. Appl. No. 16/018,426, dated Nov. 19, 2019, 3 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.

\* cited by examiner

RADIO FREQUENCY FRONT-END CIRCUIT

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). Particularly in light of carrier aggregation (CA) schemes supported by modern cellular communications networks, a mobile communication device can be configured to simultaneously transmit an outgoing radio frequency (RF) signal(s) in multiple uplink frequency bands, while receiving an incoming RF signal(s) in multiple downlink frequency bands.

To achieve the higher data rates and desirable coverage range, the mobile communication device typically employs a power amplifier(s) to increase output power of the outgoing RF signal(s) to maintain sufficient energy per bit and/or desirable signal-to-noise ratio (SNR). Notably, a higher peak associated with the outgoing RF signal(s) can cause the power amplifier(s) to move toward compression that can lead to undesirable out-of-band spectral regrowth and in-band distortion. As such, it may be necessary to bias the power amplifier(s) at a desired voltage level such that the power amplifier(s) can operate with improved linearity and efficiency.

The bias voltage is typically provided from a battery in the mobile communication device. Notably, other active components and/or circuits (e.g., microprocessors, memories, transceivers, antennas, etc.) in the mobile communication device are also drawing voltage/current from the battery, particularly when the mobile communication device transmits the outgoing RF signal(s) in a single-transmit (STX) or a dual-transmit (DTX) mode. As a result, the bias voltage received by the power amplifier(s) can decrease over time, thus causing the power amplifier(s) to suffer degraded linearity and efficiency. In this regard, it may be desired to maintain the bias voltage at the desired voltage level regardless of whether the mobile communication device is operating in STX or the DTX mode.

SUMMARY

Embodiments of the disclosure relate to a radio frequency (RF) front-end circuit. A power management circuit is configured to output a first modulated voltage and a second modulated voltage via a first voltage port(s) and a second voltage port(s), respectively. The power management circuit is also configured to output a first bias voltage and a second bias voltage via a first bias voltage port(s) and a second bias voltage port(s), respectively. An amplifier circuit(s) is coupled to a selected voltage port among the first voltage port(s) and the second voltage port(s), and a selected bias port among the first bias port(s) and the second bias port(s). The amplifier circuit(s) is configured to amplify an RF signal based on a selected modulated voltage and a selected bias voltage outputted by the selected voltage port and the selected bias voltage port, respectively. The power management circuit can be controlled to dynamically increase the selected bias voltage at the selected bias voltage port in case the selected bias voltage drops below a defined bias voltage threshold. As such, it may be possible to maintain the selected bias voltage at a desirable level, thus enabling the amplifier circuit(s) to operate with improved linearity and efficiency.

In one aspect, an RF front-end circuit is provided. The RF front-end circuit includes a power management circuit. The power management circuit is configured to output a first modulated voltage via a first voltage port. The power management circuit is also configured to output a second modulated voltage via a second voltage port. The power management circuit is also configured to output a first bias voltage via a first bias voltage port. The power management circuit is also configured to output a second bias voltage via a second bias voltage port. The RF front-end circuit also includes an amplifier circuit coupled to a selected voltage port among the first voltage port and the second voltage port and a selected bias voltage port among the first bias voltage port and the second bias voltage port. The amplifier circuit is configured to receive a selected modulated voltage and a selected bias voltage from the selected voltage port and the selected bias voltage port, respectively. The amplifier circuit is also configured to amplify an RF signal from an input power to an output power based on the selected modulated voltage and the selected bias voltage. The RF front-end circuit also includes a control circuit coupled to the power management circuit. The control circuit is configured to determine whether the selected bias voltage is lower than a defined bias voltage threshold. The control circuit is also configured to cause the power management circuit to increase the selected bias voltage at the selected bias voltage port to the defined bias voltage threshold in response to the selected bias voltage being lower than the defined bias voltage threshold.

In another aspect, an RF front-end circuit is provided. The RF front-end circuit includes a power management circuit. The power management circuit is configured to output a first modulated voltage via a first voltage port. The power management circuit is also configured to output a second modulated voltage via a second voltage port. The power management circuit is also configured to output a first bias voltage via a first bias voltage port. The power management circuit is also configured to output a second bias voltage via a second bias voltage port. The RF front-end circuit also includes an amplifier circuit coupled to a selected voltage port among the first voltage port and the second voltage port and a selected bias voltage port among the first bias voltage port and the second bias voltage port. The amplifier circuit is configured to receive a selected modulated voltage and a selected bias voltage from the selected voltage port and the selected bias voltage port, respectively. The amplifier circuit is also configured to amplify an RF signal from an input power to an output power based on the selected modulated voltage and the selected bias voltage. The power management circuit is further configured to determine whether the selected bias voltage is lower than a defined bias voltage threshold. The power management circuit is further configured to increase the selected bias voltage at the selected bias voltage port to the defined bias voltage threshold in response to the selected bias voltage being lower than the defined bias voltage threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
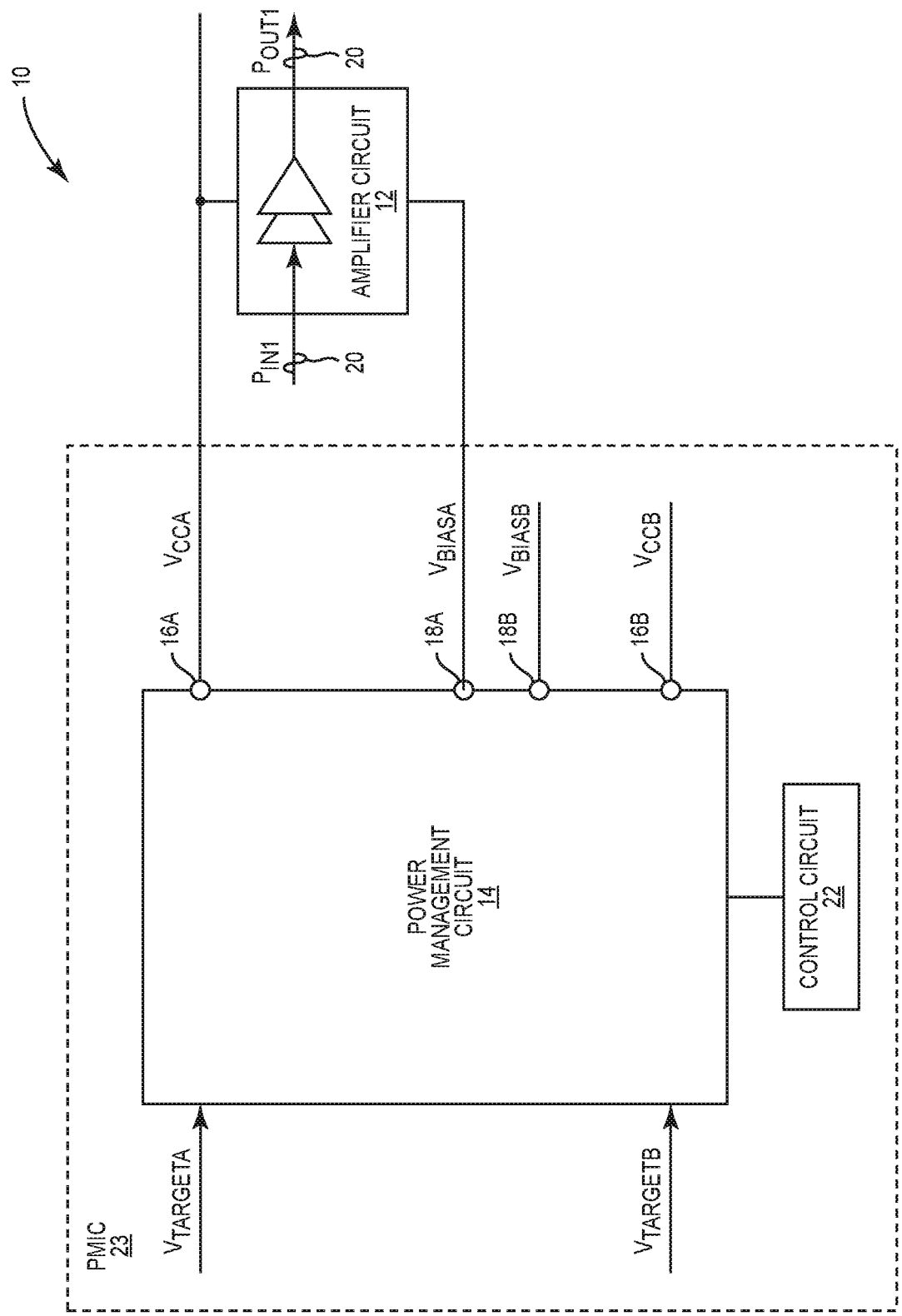
FIG. 1 is a schematic diagram of an exemplary radio frequency (RF) front-end circuit configured to improve linearity and efficiency of an amplifier circuit by providing a steady bias voltage to the amplifier circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a radio frequency (RF) front-end circuit. A power management circuit is configured to output a first modulated voltage and a second modulated voltage via a first voltage port(s) and a second voltage port(s), respectively. The power management circuit is also configured to output a first bias voltage and a second bias voltage via a first bias voltage port(s) and a second bias voltage port(s), respectively. An amplifier circuit(s) is coupled to a selected voltage port among the first voltage port(s) and the second voltage port(s), and a selected bias port among the first bias port(s) and the second bias port(s). The amplifier circuit(s) is configured to amplify an RF signal based on a selected modulated voltage and a selected bias voltage outputted by the selected voltage port and the selected bias voltage port, respectively. The power management circuit can be controlled to dynamically increase the selected bias voltage at the selected bias voltage port in case the selected bias voltage drops below a defined bias voltage threshold. As such, it may be possible to maintain the selected bias voltage at a desirable level, thus enabling the amplifier circuit(s) to operate with improved linearity and efficiency.

In this regard, FIG. 1 is a schematic diagram of an exemplary RF front-end circuit 10 configured to improve linearity and efficiency of an amplifier circuit 12 by providing a steady bias voltage to the amplifier circuit 12. In a non-limiting example, a power management circuit 14 includes at least one first voltage port 16A, at least one second voltage port 16B, at least one first bias voltage port 18A, and at least one second bias voltage port 18B. The first voltage port 16A and the second voltage port 16B are configured to output a first modulated voltage $V_{CCA}$ and a second modulated voltage $V_{CCB}$, respectively. The first bias voltage port 18A and the second bias voltage port 18B are configured to output a first bias voltage $V_{BIASA}$ and a second bias voltage $V_{BIASB}$, respectively.

The amplifier circuit 12 can be coupled to a selected voltage port among the first voltage port 16A and the second voltage port 16B, and a selected bias voltage port among the first bias voltage port 18A and the second bias voltage port 18B. As shown in FIG. 1, the amplifier circuit 12 is coupled to the first voltage port 16A and the first bias voltage port 18A. In this regard, the first voltage port 16A and the first bias voltage port 18A are referred to hereinafter as the selected voltage port and the selected bias voltage port, respectively. In this regard, the amplifier circuit 12 receives the first modulated voltage $V_{CCA}$ and the first biased voltage $V_{BIASA}$ as a selected modulated voltage and a selected bias voltage, respectively. Accordingly, the amplifier circuit 12 amplifies an RF signal 20 from an input power $P_{IN1}$ to an output power $P_{OUT1}$ based on the selected modulated voltage and the selected bias voltage.

Notably, the amplifier circuit 12 may also be coupled to the second voltage port 16B and the second bias voltage port 18B. In this regard, the second voltage port 16B and the second bias voltage port 18B will become the selected voltage port and the selected bias voltage port, respectively. Accordingly, the second modulated voltage $V_{CCB}$ and the second bias voltage $V_{BIASB}$ will be the selected modulated voltage and the selected bias voltage, respectively.

In a non-limiting example, the amplifier circuit 12 requires that the selected bias voltage be maintained at 3.15 volts (3.5 V) to help achieve desired linearity performance and efficiency. The selected bias voltage may initially be provided by a battery (not shown) capable of providing up to 4.4 V in voltage when fully charged. Given that the battery may also be powering other active components and/or circuits (e.g., transceiver, antenna, etc.), the voltage level of the battery will decrease over time, thus causing the selected bias voltage to drop as well.

As such, the RF front-end circuit 10 further includes a control circuit 22, which can be provided as a microprocessor, for example. As discussed in detail below, the control circuit 22 is configured to dynamically determine whether the selected bias voltage is lower than a defined bias voltage threshold (e.g., 3.15 V). In response to the selected bias voltage being lower than the defined bias voltage threshold, the control circuit 22 is further configured to cause the power management circuit 14 to increase the selected bias voltage at the selected bias voltage port to the defined bias voltage threshold. By maintaining the selected bias voltage steadily at the defined bias voltage threshold, it may be possible to maintain linearity performance and efficiency of the amplifier circuit 12.

In one embodiment, the control circuit 22 is separated from the power management circuit 14. In another embodiment, the control circuit 22 may be integrated with the power management circuit 14 in a power management integrated circuit (PMIC) 23. In another embodiment, functionalities of the control circuit 22 can be carried out by various components and/or circuitries in the power management circuit 14. As such, the RF front-end circuit 10 may not include an independent control circuit. It should be appreciated that the operational principles discussed hereinafter are independent from specific implementation of the control circuit 22.

Figure 2:
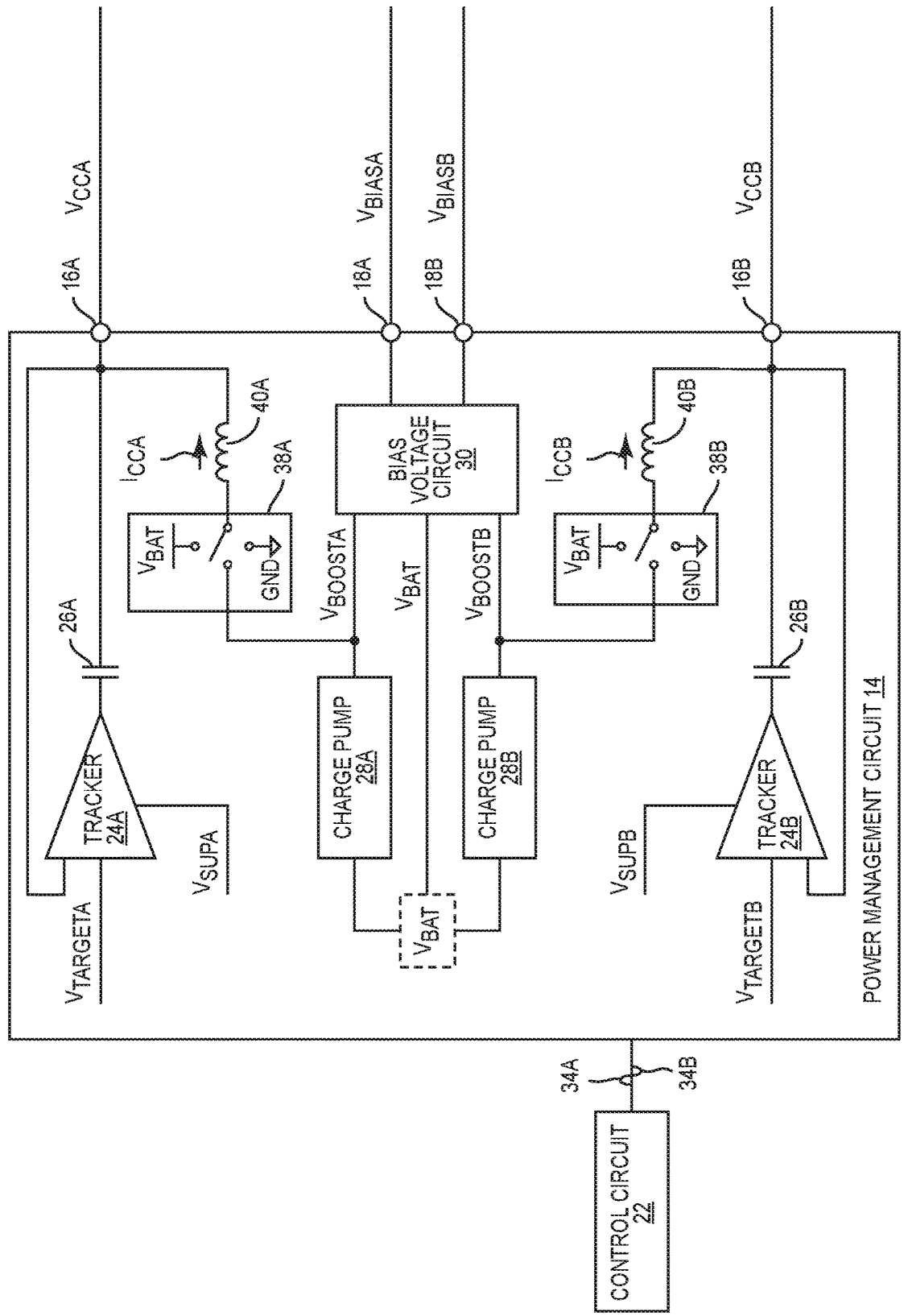
FIG. 2 is a schematic diagram providing an exemplary illustration of a power management circuit provided in the RF front-end circuit of FIG. 1 and configured according to an embodiment of the present disclosure.

FIG. 2 is a schematic diagram providing an exemplary illustration of the power management circuit 14 of FIG. 1 configured according to an embodiment of the present disclosure. Common elements between FIGS. 1 and 2 are shown therein with common element numbers and will not be re-described herein.

The power management circuit 14 includes a first tracker 24A and a second tracker 24B. The first tracker 24A is coupled to the first voltage port 16A and configured to generate the first modulated voltage $V_{CCA}$ at the first voltage port 16A based on a first supply voltage $V_{SUPA}$. In a non-limiting example, the first tracker 24A is coupled to the first voltage port 16A via a first offset capacitor 26A, which is configured to raise the first modulated voltage $V_{CCA}$ (e.g., by 1 V) before outputting the first modulated voltage $V_{CCA}$ via the first voltage port 16A. In one example, the first tracker 24A can be configured to generate the first modulated voltage $V_{CCA}$ as a first envelope tracking (ET) modulated voltage based on a first modulated target voltage $V_{TARGETA}$. In another example, the first tracker 24A can be configured to generate the first modulated voltage $V_{CCA}$ as a first average power tracking (APT) modulated voltage.

The second tracker 24B is coupled to the second voltage port 16B and configured to generate the second modulated voltage $V_{CCB}$ at the second voltage port 16B based on a second supply voltage $V_{SUPB}$. In a non-limiting example, the second tracker 24B is coupled to the second voltage port 16B via a second offset capacitor 26B, which is configured to raise the first modulated voltage $V_{CCB}$ (e.g., by 1 V) before outputting the second modulated voltage $V_{CCB}$ via the second voltage port 16B. In one example, the second tracker 24B can be configured to generate the second modulated voltage $V_{CCB}$ as a second ET modulated voltage based on a second modulated target voltage $V_{TARGETB}$. In another example, the second tracker 24B can be configured to generate the second modulated voltage $V_{CCB}$ as a second APT modulated voltage.

The power management circuit 14 includes a first charge pump 28A and a second charge pump 28B. The first charge pump 28A is configured to receive a battery voltage $V_{BAT}$ and generate a first boosted voltage $V_{BOOSTA}$ higher than the battery voltage $V_{BAT}$. In a non-limiting example, the first boosted voltage $V_{BOOSTA}$ can equal up to two times the battery voltage $V_{BAT}$ ($V_{BOOSTA}=2\times V_{BAT}$). The second charge pump 28B is configured to receive the battery voltage $V_{BAT}$ and generate a second boosted voltage $V_{BOOSTB}$ higher than the battery voltage $V_{BAT}$. In a non-limiting example, the second boosted voltage $V_{BOOSTB}$ can equal up to two times the battery voltage $V_{BAT}$ ($V_{BOOSTB}=2\times V_{BAT}$).

The power management circuit 14 includes a bias voltage circuit 30. The bias voltage circuit 30 is coupled to the first charge pump 28A, the second charge pump 28B, the first bias voltage port 18A, and the second bias voltage port 18B. The bias voltage circuit 30 is configured to generate the selected bias voltage (e.g., the first bias voltage $V_{BIASA}$ or the second bias voltage $V_{BIASB}$) based on a selected input voltage among the first boosted voltage $V_{BOOSTA}$, the second boosted voltage $V_{BOOSTB}$, and the battery voltage $V_{BAT}$.

Figure 3:
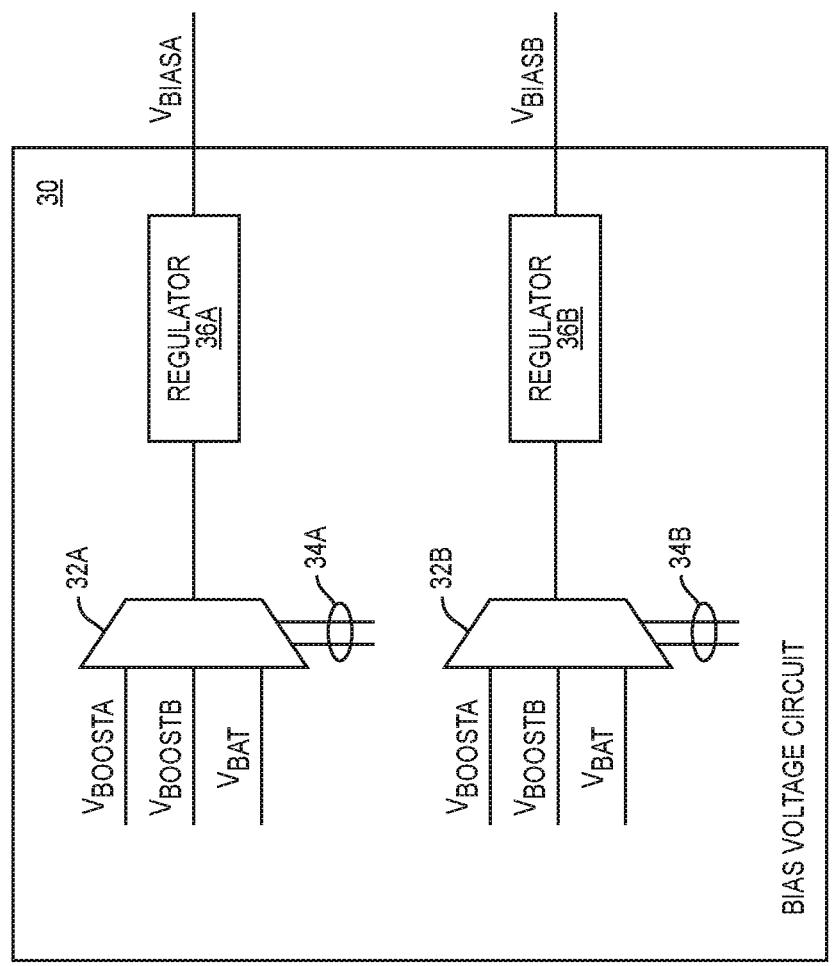
FIG. 3 is a schematic diagram providing an exemplary illustration of a bias voltage circuit provided in the power management circuit of FIG. 2 according to an embodiment of the present disclosure.

FIG. 3 is a schematic diagram providing an exemplary illustration of the bias voltage circuit 30 of FIG. 2 according to an embodiment of the present disclosure. The bias voltage circuit 30 includes a first multiplexer 32A and a second multiplexer 32B. The first multiplexer 32A receives the first boosted voltage $V_{BOOSTA}$, the second boosted voltage $V_{BOOSTB}$, and the battery voltage $V_{BAT}$. The control circuit 22 of FIG. 2 (not shown) may control the first multiplexer 32A via a first control signal 34A to output a selected one of the first boosted voltage $V_{BOOSTA}$, the second boosted voltage $V_{BOOSTB}$, and the battery voltage $V_{BAT}$ as the first bias voltage $V_{BIASA}$. The second multiplexer 32B receives the first boosted voltage $V_{BOOSTA}$, the second boosted voltage $V_{BOOSTB}$, and the battery voltage $V_{BAT}$. The control circuit 22 of FIG. 2 (not shown) may control the second multiplexer 32B via a second control signal 34B to output a selected one of the first boosted voltage $V_{BOOSTA}$, the second boosted voltage $V_{BOOSTB}$, and the battery voltage $V_{BAT}$ as the second bias voltage $V_{BIASB}$. In this regard, the control circuit 22 may selectively control the first multiplexer 32A and/or the second multiplexer 32B to output the first bias voltage $V_{BIASA}$ and/or the second bias voltage $V_{BIASB}$ via the first control signal 34A and/or the second control signal 34B.

As previously discussed, the first boosted voltage $V_{BOOSTA}$ and the second boosted voltage $V_{BOOSTB}$ may each equal up to two times the battery voltage $V_{BAT}$. Assuming that the amplifier circuit 12 of FIG. 1 (not shown) requires the selected bias voltage to be maintained at 3.15 V and the battery voltage $V_{BAT}$ currents to stand at 2.5 V, the first multiplexer 32A would output the first bias voltage $V_{BIASA}$ at about 5 V, which is higher than the 3.15 V bias voltage needed by the amplifier circuit 12. As such, the bias voltage circuit 30 may further include a first regulator 36A to regulate the first bias voltage $V_{BIASA}$ before providing the first bias voltage $V_{BIASA}$ to the first bias voltage port 18A of FIG. 2 (not shown). Similarly, the bias voltage circuit 30 may further include a second regulator 36B to regulate the second bias voltage $V_{BIASB}$ before providing the second bias voltage $V_{BIASB}$ to the second bias voltage port 18B of FIG. 2 (not shown).

With reference back to FIG. 2, the power management circuit 14 may further include a first switcher 38A and a second switcher 38B. The first switcher 38A is coupled to the first voltage port 16A via a first inductor 40A. The second switcher 38B is coupled to the second voltage port 16B via a second inductor 40B. Notably, the first switcher 38A and the second switcher 38B can be implemented based on any number, type, and layout of switches without affecting functionalities of the first switcher 38A and the second switcher 38B. In a non-limiting example, the first switcher 38A and the second switcher 38B each includes a single-pole three-throw (SP3T) switch.

The first switcher 38A is configured to receive the battery voltage $V_{BAT}$ and the first boosted voltage $V_{BOOSTA}$. In this regard, the first switcher 38A can be controlled to selectively output one of the battery voltage $V_{BAT}$, the first boosted voltage $V_{BOOSTA}$, or zero volt voltage. The voltage outputted by the first switcher 38A causes the first inductor 40A to induce a first current $I_{CCA}$ at the first voltage port 16A. The first current $I_{CCA}$ can be a direct current, an alternating current, or a combination of both.

The second switcher 38B is configured to receive the battery voltage $V_{BAT}$ and the second boosted voltage $V_{BOOSTB}$. In this regard, the second switcher 38B can be controlled to selectively output one of the battery voltage $V_{BAT}$, the second boosted voltage $V_{BOOSTB}$, and 0 V voltage. The voltage outputted by the second switcher 38B causes the second inductor 40B to induce a second current $I_{ccB}$ at the second voltage port 16B. The second current $I_{CCB}$ can be a direct current, an alternating current, or a combination of both.

Figure 4A:
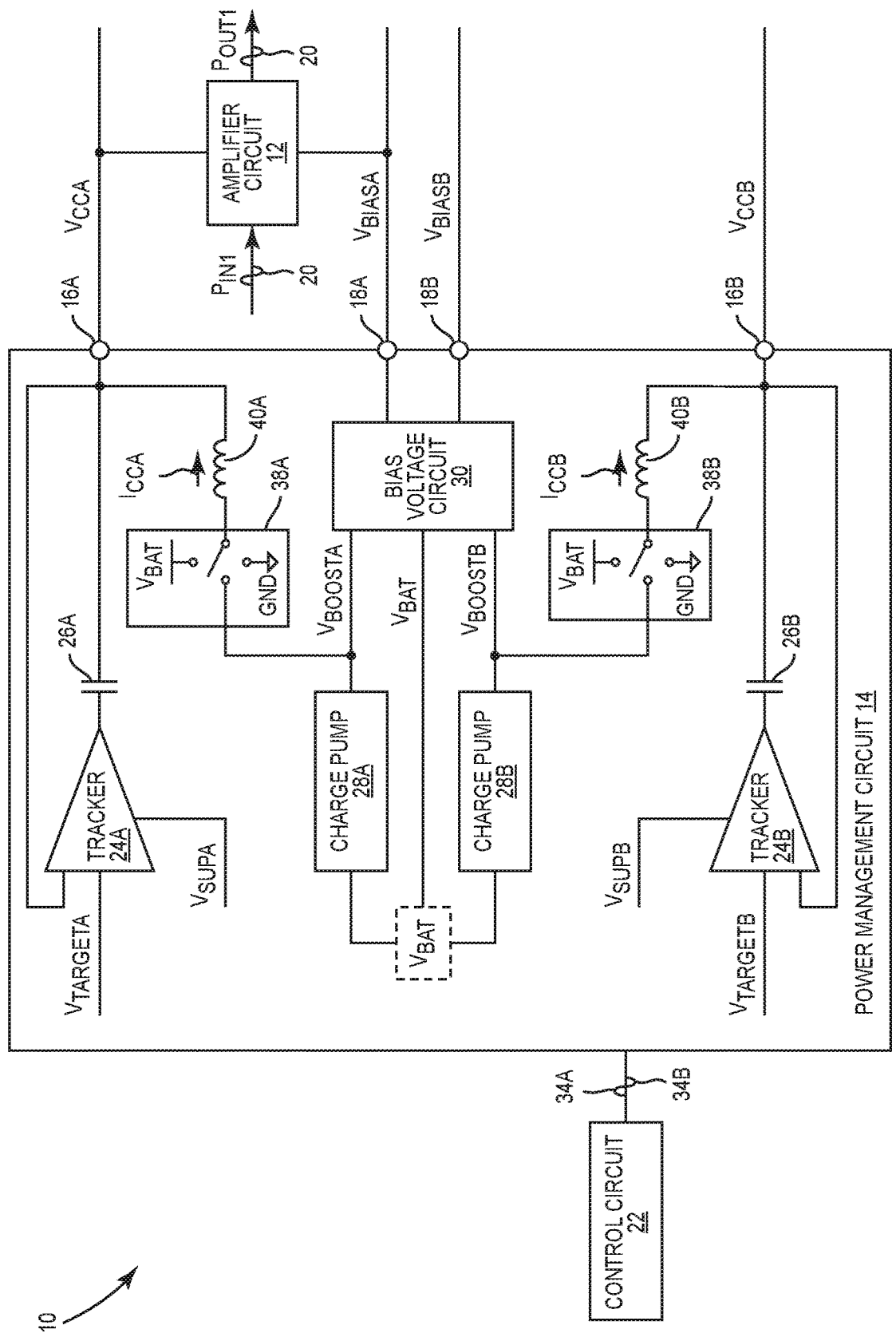
FIG. 4A is a schematic diagram providing an exemplary illustration of the power management circuit of FIG. 2 configured according to one embodiment of the present disclosure to enable single-transmit (STX) operation.

In one embodiment, the amplifier circuit 12 of FIG. 1 (not shown) may be coupled to the first voltage port 16A and the first bias voltage port 18A, as shown in FIG. 4A. In this regard, FIG. 4A is a schematic diagram providing an exemplary illustration of the power management circuit 14 of FIG. 2 configured according to one embodiment of the present disclosure to enable single-transmit (STX) operation. Common elements between FIGS. 1, 2, and 4A are shown therein with common element numbers and will not be re-described herein.

As shown in FIG. 4A, the amplifier circuit 12 is coupled to the first voltage port 16A and the first bias voltage port 18A to receive the first modulated voltage $V_{CCA}$ and the first bias voltage $V_{BIASA}$, respectively. The control circuit 22 is configured to determine whether the first bias voltage $V_{BIASA}$ is higher than or equal to the defined bias voltage threshold. If the first bias voltage $V_{BIASA}$ is higher than or equal to the defined bias voltage threshold, the control circuit 22 controls the first multiplexer 32A (not shown) in the bias voltage circuit 30 via the first control signal 34A to output the battery voltage $V_{BAT}$ to the first regulator 36A (not shown) and, thus, the first bias voltage port 18A. In contrast, if the first bias voltage $V_{BIASA}$ is lower than the defined bias voltage threshold, the control circuit 22 controls the first multiplexer 32A in the bias voltage circuit 30 via the first control signal 34A to output the second boosted voltage $V_{BOOSTB}$ to the first regulator 36A and, thus, the first bias voltage port 18A. The control circuit 22 may not provide the second control signal 34B to the second multiplexer 32B (not shown) in the bias voltage circuit 30. As such, the second bias voltage $V_{BIASB}$ will not be provided to the second regulator 36B and the second bias voltage port 18B. The control circuit 22 may further control the second switcher 38B to decouple the second charge pump 28B from the second voltage port 16B.

Figure 4B:
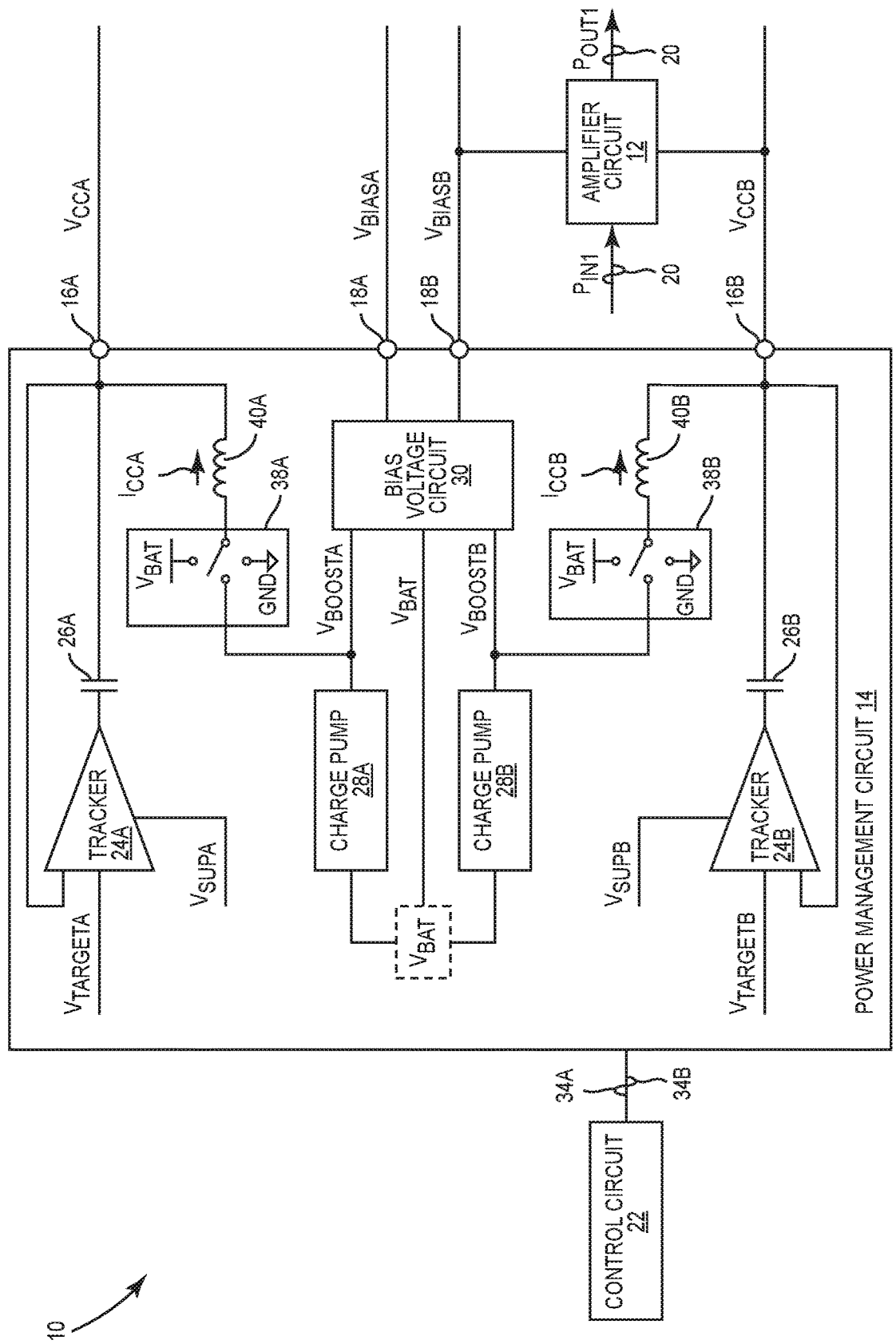
FIG. 4B is a schematic diagram providing an exemplary illustration of the power management circuit of FIG. 2 configured according to another embodiment of the present disclosure to enable STX operation.

In another embodiment, the amplifier circuit 12 of FIG. 1 (not shown) may be coupled to the second voltage port 16B and the second bias voltage port 18B, as shown in FIG. 4B. In this regard, FIG. 4B is a schematic diagram providing an exemplary illustration of the power management circuit 14 of FIG. 2 configured according to another embodiment of the present disclosure to enable STX operation. Common elements between FIGS. 1, 2, and 4B are shown therein with common element numbers and will not be re-described herein.

As shown in FIG. 4B, the amplifier circuit 12 is coupled to the second voltage port 16B and the second bias voltage port 18B to receive the second modulated voltage $V_{CCB}$ and the second bias voltage $V_{BIASB}$, respectively. The control circuit 22 is configured to determine whether the second bias voltage $V_{BIASB}$ is higher than or equal to the defined bias voltage threshold. If the second bias voltage $V_{BIASB}$ is higher than or equal to the defined bias voltage threshold, the control circuit 22 controls the second multiplexer 32B (not shown) in the bias voltage circuit 30 via the second control signal 34B to output the battery voltage $V_{BAT}$ to the second regulator 36B (not shown) and, thus, the second bias voltage port 18B. In contrast, if the second bias voltage $V_{BIASB}$ is lower than the defined bias voltage threshold, the control circuit 22 controls the second multiplexer 32B in the bias voltage circuit 30 via the second control signal 34B to output the first boosted voltage $V_{BOOSTA}$ to the second regulator 36B and, thus, the second bias voltage port 18B. The control circuit 22 may not provide the first control signal 34A to the first multiplexer 32A (not shown) in the bias voltage circuit 30. As such, the first bias voltage $V_{BIASA}$ will not be provided to the first regulator 36A and the first bias voltage port 18A. The control circuit 22 may further control the first switcher 38A to decouple the first charge pump 28A from the first voltage port 16A.

Figure 5:
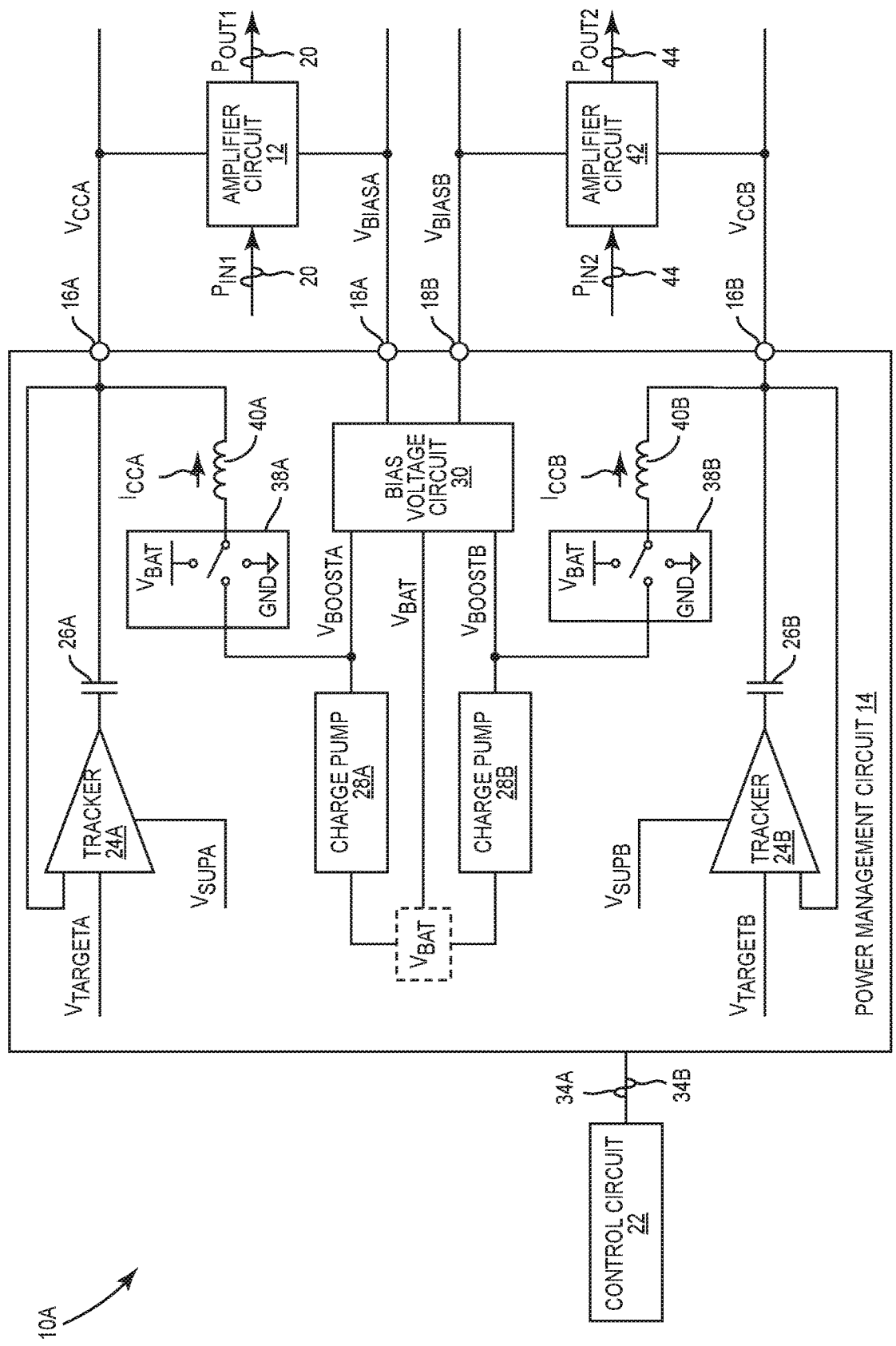
FIG. 5 is a schematic diagram of an exemplary RF front-end circuit 10A configured to support dual-transmit (DTX) operation.

In another embodiment, the RF front-end circuit 10 of FIG. 1 may include a second amplifier circuit to support dual-transmit (DTX) operation, such as carrier aggregation, as shown in FIG. 5. In this regard, FIG. 5 is a schematic diagram of an exemplary RF front-end circuit 10A configured to support dual-transmit (DTX) operation. Common elements between FIGS. 1, 2, and 5 are shown therein with common element numbers and will not be re-described herein.

The RF front-end circuit 10A includes a second amplifier circuit 42. In this regard, the amplifier circuit 12 is coupled to the first voltage port 16A and the first bias voltage port 18A, while the second amplifier circuit 42 is coupled to the second voltage port 16B and the second bias voltage port 18B. Accordingly, the amplifier circuit 12 receives the first modulated voltage $V_{CCA}$ and the first bias voltage $V_{BIASA}$, and the second amplifier circuit 42 receives the second modulated voltage $V_{CCB}$ and the second bias voltage $V_{BIASB}$. Accordingly, the second amplifier circuit 42 amplifies a second RF signal 44 from a second input power $P_{IN2}$ to a second output power $P_{OUT2}$ based on the second modulated voltage $V_{CCB}$ and the second bias voltage $V_{BIASB}$.

The control circuit 22 determines whether the battery voltage $V_{BAT}$ is higher than or equal to the defined bias voltage threshold. If the battery voltage $V_{BAT}$ is higher than or equal to the defined bias voltage threshold, the control circuit 22 controls the first multiplexer 32A (not shown) and the second multiplexer 32B (not shown) via the first control signal 34A and the second control signal 34B to output the battery voltage $V_{BAT}$ to the first bias voltage port 18A and the second bias voltage port 18B, respectively.

In the event that the battery voltage $V_{BAT}$ is lower than the defined bias voltage threshold, the control circuit 22 is further configured to determine which of the output power $P_{OUT1}$ and the second output power $P_{OUT2}$ is higher. More specifically, the control circuit 22 determines that the output power $P_{OUT1}$ is higher than the second output power $P_{OUT2}$ if the output power $P_{OUT1}$ is higher than a defined power threshold and the second output power $P_{OUT2}$ is low than or equal to the defined power threshold. In contrast, the control circuit 22 determines that the second output power $P_{OUT2}$ is higher than the output power $P_{OUT1}$ if the second output power $P_{OUT2}$ is higher than the defined power threshold and the output power $P_{OUT1}$ is lower than or equal to the defined power threshold. In a non-limiting example, the defined power threshold is 3 decibels (3 dB) below a defined power ceiling for the RF front-end circuit 10A (defined power threshold=defined power ceiling−3 dB).

If the output power $P_{OUT1}$ is determined to be higher than the second output power $P_{OUT2}$, the control circuit 22 controls the first multiplexer 32A to output the second boosted voltage $V_{BOOST2}$ at the first bias voltage port 18A as the first bias voltage $V_{BIASA}$. In this regard, the first bias voltage $V_{BIASA}$ is maintained at the defined bias voltage threshold. Concurrently, the control circuit 22 controls the second multiplexer 32B to output the battery voltage $V_{BAT}$ at the second bias voltage port 18B as the second bias voltage $V_{BIASB}$. Although the second amplifier circuit 42 receives the second bias voltage $V_{BIASB}$ lower than the defined bias voltage threshold, operation of the second amplifier circuit 42 may not be negatively impacted since the second output power $P_{OUT2}$ of the second amplifier circuit 42 is lower than the output power $P_{OUT1}$ of the amplifier circuit 12.

In contrast, if the second output power $P_{OUT2}$ is determined to be higher than the output power $P_{OUT1}$, the control circuit 22 controls the first multiplexer 32A to output the battery voltage $V_{BAT}$ at the first bias voltage port 18A as the first bias voltage $V_{BIASA}$. Although the amplifier circuit 12 receives the first bias voltage $V_{BIASA}$ lower than the defined bias voltage threshold, operation of the amplifier circuit 12 may not be negatively impacted since the output power $P_{OUT1}$ of the amplifier circuit 12 is lower than the second output power $P_{OUT2}$ of the second amplifier circuit 42. Concurrently, the control circuit 22 controls the second multiplexer 32B to output the first boosted voltage $V_{BOOST4}$ at the second bias voltage port 18B as the second bias voltage $V_{BIASB}$. In this regard, the second bias voltage $V_{BIASB}$ is maintained at the defined bias voltage threshold.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) front-end circuit comprising:
   a power management circuit configured to:
   output a first modulated voltage via a first voltage port;
   output a second modulated voltage via a second voltage port;
   output a first bias voltage via a first bias voltage port; and
   output a second bias voltage via a second bias voltage port;
   an amplifier circuit coupled to a selected voltage port among the first voltage port and the second voltage port and a selected bias voltage port among the first bias voltage port and the second bias voltage port, the amplifier circuit configured to:
   receive a selected modulated voltage and a selected bias voltage from the selected voltage port and the selected bias voltage port, respectively; and
   amplify an RF signal from an input power to an output power based on the selected modulated voltage and the selected bias voltage; and
   a control circuit coupled to the power management circuit and configured to:
   determine whether the selected bias voltage is lower than a defined bias voltage threshold; and
   cause the power management circuit to increase the selected bias voltage at the selected bias voltage port to the defined bias voltage threshold in response to the selected bias voltage being lower than the defined bias voltage threshold.

2. The RF front-end circuit of claim 1 wherein the power management circuit comprises:
   a first tracker coupled to the first voltage port and configured to generate the first modulated voltage;
   a second tracker coupled to the second voltage port and configured to generate the second modulated voltage;
   a first charge pump configured to receive a battery voltage and generate a first boosted voltage higher than the battery voltage;
   a second charge pump configured to receive the battery voltage and generate a second boosted voltage higher than the battery voltage; and
   a bias voltage circuit coupled to the first charge pump and the second charge pump, the bias voltage circuit configured to generate the selected bias voltage at the selected bias voltage port based on a selected input voltage among the first boosted voltage, the second boosted voltage, and the battery voltage.

3. The RF front-end circuit of claim 2 wherein the first boosted voltage and the second boosted voltage are both equal to two times the battery voltage.

4. The RF front-end circuit of claim 2 wherein:
the first tracker is further configured to generate a first envelope tracking (ET) modulated voltage based on a first modulated target voltage; and
the second tracker is further configured to generate a second ET modulated voltage based on a second modulated target voltage.

5. The RF front-end circuit of claim 2 wherein:
the first tracker is further configured to generate a first average power tracking (APT) modulated voltage; and
the second tracker is further configured to generate a second APT modulated voltage.

6. The RF front-end circuit of claim 2 wherein the bias voltage circuit comprises:
a first multiplexer configured to:
receive the first boosted voltage, the second boosted voltage, and the battery voltage; and
output a selected one of the first boosted voltage, the second boosted voltage, and the battery voltage as the first bias voltage;
a first regulator coupled to the first multiplexer and configured to regulate the first bias voltage to the defined bias voltage threshold;
a second multiplexer configured to:
receive the first boosted voltage, the second boosted voltage, and the battery voltage; and
output a selected one of the first boosted voltage, the second boosted voltage, and the battery voltage as the second bias voltage; and
a second regulator coupled to the second multiplexer and configured to regulate the second bias voltage to the defined bias voltage threshold.

7. The RF front-end circuit of claim 6 wherein the control circuit is further configured to selectively control at least one of the first multiplexer and the second multiplexer to output at least one of the first bias voltage and the second bias voltage.

8. The RF front-end circuit of claim 6 wherein the control circuit is further configured to determine whether the battery voltage is higher than or equal to the defined bias voltage threshold.

9. The RF front-end circuit of claim 8 wherein:
the amplifier circuit is coupled to the first voltage port and the first bias voltage port; and
the control circuit is further configured to:
control the first multiplexer via a first control signal to output the battery voltage as the first bias voltage in response to the battery voltage being greater than or equal to the defined bias voltage threshold; and
control the first multiplexer via the first control signal to output the first boosted voltage as the first bias voltage in response to the battery voltage being lower the defined bias voltage threshold.

10. The RF front-end circuit of claim 8 wherein:
the amplifier circuit is coupled to the second voltage port and the second bias voltage port; and
the control circuit is further configured to:
control the second multiplexer via a second control signal to output the battery voltage as the second bias voltage in response to the battery voltage being greater than or equal to the defined bias voltage threshold; and
control the second multiplexer via the second control signal to output the second boosted voltage as the second bias voltage in response to the battery voltage being lower the defined bias voltage threshold.

11. The RF front-end circuit of claim 6 further comprising a second amplifier circuit, wherein:
the amplifier circuit is coupled to the first voltage port and the first bias voltage port, the amplifier circuit configured to amplify the RF signal from the input power to the output power based on the first modulated voltage and the first bias voltage; and
the second amplifier circuit is coupled to the second voltage port and the second bias voltage port, the second amplifier circuit configured to amplify a second RF signal from a second input power to a second output power based on the second modulated voltage and the second bias voltage.

12. The RF front-end circuit of claim 11 wherein the control circuit is further configured to control the first multiplexer and the second multiplexer to output the battery voltage as the first bias voltage and the second bias voltage, respectively, in response to the battery voltage being higher than or equal to the defined bias voltage threshold.

13. The RF front-end circuit of claim 11 wherein the control circuit is further configured to determine which of the output power and the second output power is higher in response to the battery voltage being lower than the defined bias voltage threshold.

14. The RF front-end circuit of claim 13 wherein the control circuit is further configured to:
determine that the output power of the amplifier circuit is higher than the second output power of the second amplifier circuit in response to the output power being higher than a defined power threshold and the second output power being lower than or equal to the defined power threshold; and
determine that the output power of the amplifier circuit is lower than the second output power of the second amplifier circuit in response to the output power being lower than or equal to the defined power threshold and the second output power being higher than the defined power threshold.

15. The RF front-end circuit of claim 14 wherein the defined power threshold is predetermined as being 3 decibels (dB) below a defined power ceiling for the RF front-end circuit.

16. The RF front-end circuit of claim 13 wherein, in response to the output power being higher than the second output power, the control circuit is further configured to:
control the first multiplexer to output the second boosted voltage as the first bias voltage; and
control the second multiplexer to output the battery voltage as the second bias voltage.

17. The RF front-end circuit of claim 13 wherein, in response to the output power being lower than the second output power, the control circuit is further configured to:
control the first multiplexer to output the battery voltage as the first bias voltage; and
control the second multiplexer to output the first boosted voltage as the second bias voltage.

18. The RF front-end circuit of claim 1 wherein the power management circuit and the control circuit are integrated into a power management integrated circuit (PMIC).

19. A radio frequency (RF) front-end circuit comprising:
a power management circuit configured to:
output a first modulated voltage via a first voltage port;
output a second modulated voltage via a second voltage port;

output a first bias voltage via a first bias voltage port; and output a second bias voltage via a second bias voltage port;

an amplifier circuit coupled to a selected voltage port among the first voltage port and the second voltage port and a selected bias voltage port among the first bias voltage port and the second bias voltage port, the amplifier circuit configured to:

receive a selected modulated voltage and a selected bias voltage from the selected voltage port and the selected bias voltage port, respectively; and amplify an RF signal from an input power to an output power based on the selected modulated voltage and the selected bias voltage; and wherein the power management circuit is further configured to:

determine whether the selected bias voltage is lower than a defined bias voltage threshold; and increase the selected bias voltage at the selected bias voltage port to the defined bias voltage threshold in response to the selected bias voltage being lower than the defined bias voltage threshold.

20. The RF front-end circuit of claim 19 wherein the power management circuit comprises:

a first tracker coupled to the first voltage port and configured to generate the first modulated voltage;

a second tracker coupled to the second voltage port and configured to generate the second modulated voltage;

a first charge pump configured to receive a battery voltage and generate a first boosted voltage higher than the battery voltage;

a second charge pump configured to receive the battery voltage and generate a second boosted voltage higher than the battery voltage; and a bias voltage circuit coupled to the first charge pump and the second charge pump, the bias voltage circuit configured to generate the selected bias voltage at the selected bias voltage port based on a selected input voltage among the first boosted voltage, the second boosted voltage, and the battery voltage.

21. The RF front-end circuit of claim 20 wherein the bias voltage circuit comprises:

a first multiplexer configured to:

receive the first boosted voltage, the second boosted voltage, and the battery voltage; and output a selected one of the first boosted voltage, the second boosted voltage, and the battery voltage as the first bias voltage;

a first regulator coupled to the first multiplexer and configured to regulate the first bias voltage to the defined bias voltage threshold;

a second multiplexer configured to:

receive the first boosted voltage, the second boosted voltage, and the battery voltage; and output a selected one of the first boosted voltage, the second boosted voltage, and the battery voltage as the second bias voltage; and a second regulator coupled to the second multiplexer and configured to regulate the second bias voltage to the defined bias voltage threshold.

* * * * *